United States Patent
Rheinfelder et al.

(10) Patent No.: US 7,825,842 B2
(45) Date of Patent: Nov. 2, 2010

(54) DIGITAL SIGMA-DELTA MODULATORS

(75) Inventors: Clemens Rheinfelder, Blaustein (DE);
Werner Korte, Eschwege (DE);
Ingeborg Sigrid Ilse-Dore Korte-Gericke, legal representative, Eschwege (DE)

(73) Assignee: Ubidyne, Inc., Wilmington, DE (US)

( * ) Notice: Subject to any disclaimer, the term of this patent is extended or adjusted under 35 U.S.C. 154(b) by 175 days.

(21) Appl. No.: 12/325,690

(22) Filed: Dec. 1, 2008

(65) Prior Publication Data

US 2009/0237284 A1  Sep. 24, 2009

Related U.S. Application Data

(63) Continuation-in-part of application No. PCT/EP2007/004896, filed on Jun. 1, 2007.

(60) Provisional application No. 60/810,460, filed on Jun. 2, 2006.

(30) Foreign Application Priority Data

Jun. 2, 2006  (GB) ................ 0611096.6

(51) Int. Cl.
*H03M 3/02* (2006.01)

(52) U.S. Cl. ..................... 341/143; 341/76
(58) Field of Classification Search ........... 341/76, 341/77, 143
See application file for complete search history.

(56) References Cited

U.S. PATENT DOCUMENTS

| | | | |
|---|---|---|---|
| 5,345,233 A * | 9/1994 | Nagata et al. | 341/76 |
| 6,642,874 B1 * | 11/2003 | Lin et al. | 341/143 |
| 2004/0233086 A1 * | 11/2004 | Kiss et al. | 341/143 |

FOREIGN PATENT DOCUMENTS

GB  2408858  6/2005

OTHER PUBLICATIONS

International Preliminary Examinaton Report in PCT/EP2007/004896, Dec. 2008.*
Hossack DM et al: "The application of redundant number systems to digital sigma-delta modulators" Circuits and Systems, 1994. ISCAS '94, 1994 IEEE International Symposium on London, UK May 30-Jun. 2, 1994, New York, NY, USA,IEEE, US, vol . 2, May 30, 1994, pp. 481-484, XP010143079 ISBN: 0-7803-1915-X p. 482, left-hand column, lines 8-20.
Roncella R et al: "A VLSI Systolic Adder for Digital Filtering for Delta-Modulated Signals" IEEE Transactions of Acoustics, Speech and Signal Processing, IEEE Inc. New York, US, vol. 37, No. 5, May 1, 1989, pp. 749-754, XP000252731, ISSN: 0096-3518.
Wong et al: "FIR Filters With Sigma-Delta Modulation Encoding" retrieved from the internet on the Aug. 31, 2006 via: http://ieeexplore.ieee.org/iel1/29/2024/00056058.pdf?arnumber=56058#search=%22systolic%20filter%20modulation%20sigma&20delat%22. see esp. p. 980 top of second column.

* cited by examiner

*Primary Examiner*—Howard Williams
(74) *Attorney, Agent, or Firm*—Stephen H. Eland; Dann, Dorfman, Herrell & Skillman

(57) ABSTRACT

A digital sigma-delta modulator (100) for modulating a digital input signal (x) is described. The digital sigma-delta modulator (100) comprises a quantizer (115) for quantizing an input signal (s) and producing a quantized output signal (y) at a first output (110) and an error output signal (−q) at a second output (165), at least one feedback loop (120, 125) connected to an input adder (140) and the first outputs (110) and the second output (165) of the quantizer (115) and a feedback filter (130, 135) in the at least one feedback loop (120, 125). The input adder (140) produces the sum signal (s) by adding the digital input signal (x) at an input (105) and output signals of the at least one feedback loop filters (130, 135).

18 Claims, 16 Drawing Sheets

2nd Order Digital Sigma Delta LPM with Stabilisation by different $H_2(z)$

DIGITAL SIGMA-DELTA MODULATORS

CROSS-REFERENCES TO RELATED APPLICATIONS

This application is a continuation-in-part of International Patent Application No. PCT/EP2007004896, filed Jun. 1, 2007, which claims priority to U.S. provisional application No. 60/810,460, filed Jun. 2, 2006, and UK patent application GB 0611096.9, filed Jun. 2, 2006. The entire disclosure of each of the foregoing applications is hereby incorporated herein by reference.

FIELD OF THE INVENTION

This application relates to the field of digital sigma-delta modulators used in digital-to-analog converters. This application also relates to a computer program product embodied on a computer-readable medium and comprising executable instructions for the manufacture of the digital sigma-delta modulator.

DESCRIPTION OF THE RELATED ART

Mobile communications technology has greatly advanced in recent years, as evident by the higher performance of digital mobile telephones now available. To a large extent, these advances stem from the widespread deployment of modern digital wireless modulation technologies such as time division multiple access (TDMA), code division multiple access (CDMA) technologies including conventional CDMA, wideband CDMA (WCDMA), CDMA2000 and more recently 3G or UMTS standards, and the personal communications service (PCS) standard. The carrier frequencies for these modulated signals ranges from on the order of 400 MHz to as high as 12 GHz. These and other digital modulation and communications techniques have greatly improved wireless telephone services, at reduced cost to the consumer.

Such mobile telephone technology requires digital-to-analog converters of high resolution in order to convert a digital input signal having a word length of 12 bit or even more to an analog output signal within a high dynamic range. Conventional D/A converters therefore utilize a fine conversion step size applying several thousand voltage levels to represent the converted signal in the analog domain.

The well known sigma-delta D/A converters, however, comprise a digital sigma-delta modulator followed by a D/A converter utilizing only a few voltage levels to represent the converted signal in the analog domain. In order to cope with the input signal format of the D/A converter determined by the coarse conversion step size the digital sigma-delta modulator uses a coarse quantizer at its output. Nevertheless, a high resolution is achieved by applying quantization error feedback within the modulator which is operated at an over-sampling rate being a multiple of the Nyquist rate. As a result, the quantization noise is shaped into a high-pass characteristic whereas the quantization error is suppressed most at low frequencies. However, because the total root-mean-square (RMS) quantization error is ultimately limited by the D/A conversion step size, the reduction in the low frequency quantization noise is therefore accompanied by an increase in quantization noise at high frequencies. Hence, analog low-pass filters are generally used following the sigma-delta D/A converter to attenuate this undesired quantization noise at high frequencies.

As noted above, one application of particular interest for sigma-delta D/A converters is in mobile radios utilized in modern digital communication systems. In such applications, a complex digital base-band signal comprises an in-phase component (I) and a quadrature component (Q) which must be up-converted to provide a digital band-pass signal. After being D/A converted, filtered and amplified the out coming analog band-pass signal can be transmitted as RF signal having a bandwidth $f_{BW}$ at carrier frequencies in the GHz range. This application is well known in the art as "direct up-conversion". Carrier signal is defined broadly herein as referring to the abovementioned RF signal.

Base stations used in mobiles communications networks are typically transmitting more than one carrier signal per sector in order to reduce costs and to optimally use the space available on site. This means that the RF front ends require high bandwidth and also a high dynamic range in order to separate out the different carrier signals which, in some cases, might be provided by different network operators in a site sharing manner. Thus, for multi-carrier and multi-operator application it is a requirement for the RF front-ends to achieve a high operating bandwidth of 60 MHz in combination with a signal to noise ratio being greater than 90 dB full scale in order to overcome the so-called near-far problem characterised as follows. Within one cell (area covered by the antenna) one mobile user is close to the base-station antenna whilst another user is situated much further away e.g. at the cell edge.

It is known in the art that a high resolution bandwidth of 60 MHz at carrier frequencies in the GHz range with a signal to noise ratio greater than 90 dB could be achieved by using digital Sigma-Delta band-pass modulation of higher order (>6) provided that the digital-to-analog converter following the modulator offers extremely high linearity. Otherwise the high signal to noise ratio provided by the digital Sigma-Delta modulator within its pass-band is lost due to intermodulation caused by non-linear effects in the digital-to-analog converter.

Extremely high linearity of digital-to-analog conversion in the GHz frequency range is economically achievable only with not more than two or three (−1, 0, +1) representative levels which limits the resolution of the quantizer within the Sigma-Delta modulator to 1 or 1.5 bit.

However, time-discrete sigma-delta low pass modulators or band-pass modulators of higher orders ($\geqq$3 for low pass modulators and $\geqq$6 for band-pass modulators) comprising only a 1 or 1.5 bit quantizer tend to be instable due to quantizer overload. Thus, special precautions must be taken to safeguard stable operation of digital Sigma-Delta modulators of higher order without the need to use multi-bit quantizers.

Currently it has not been possible to realize such modulators using CMOS technology. It is at least conceivable that such modulators could be constructed using GaAs technology, but this would require substantial amounts of power.

The article "A VLSI Systolic Adder for Digital Filtering of Delta-Modulated Signals" by R. Roncella and R. Saletti, IEEE Transactions on Acoustics, Speech, and Signal Processing, Vol. 31, No. 5, May 1989 describes the application of a fully systolic VLSI architecture in a digital FIR filter. The FIR filter is a feed-forward filter having no feedback loop and no feedback filter in the feedback loop. Due to the absence of feedback, stability is not critical for the FIR filter described in this article. The entire disclosure of this article is hereby incorporated into the description.

Another article entitled "FIR filters with Sigma-Delta Modulation Encoding" by Ping Wah Wong, IEEE Transactions on Acoustics, Speech, and Signal Processing, Vol. 38, No. 6, June 1990 describes methods for building FIR digital filters where either the impulse response or the input signal is encoded using sigma-delta modulation. This approach allows the use of a multiplier-free structure of the FIR filter. The entire disclosure of this article is hereby incorporated into the description.

The article "The application of redundant number systems to digital sigma-delta modulators" by D. M. Hossack et al. suggest the use of redundant number system adders constructed as a systolic array in the loop filter of a digital sigma-delta modulator, but actually describes a pipelined implementation only. The entire disclosure of this article is hereby incorporated into the description.

As technological background UK patent application GB 2 408 858 A is mentioned. GB 2 408 858 A describes a word length reduction circuit having standard feedback filter arrangements in the feedback loop. The entire disclosure of GB 2 408 858 A is hereby incorporated into the description.

BRIEF SUMMARY OF THE INVENTION

It is therefore an aspect of the teachings of this application to provide low cost, stable and fast digital Sigma-Delta modulators of higher order with single-bit quantization for band-pass and low-pass applications.

It is furthermore an aspect of the teachings of this application to provide low-cost, low energy, stable and fast digital-to-analog converters performing direct conversion in the GHz frequency range.

The teachings of this application therefore are directed to a digital sigma-delta modulator for modulating a digital input signal comprising a quantizer for quantizing a sum signal and producing a quantized output signal at a first output and an error output signal at a second output; at least one feedback loop connected to an input adder and to at least one of the first output or the second output of the quantizer. The input adder produces the sum signal by adding the digital input signal at an input and output signals of the at least one feedback loop. A feedback filter in the at least one feedback loop whereby the digital sigma-delta modulator is constructed as a systolic array.

Optional technical features of the sigma-delta modulator are described in dependent claims.

Alternatively, a digital sigma-delta modulator for modulating a digital input signal comprises:
 a quantizer for quantizing a sum signal (s) and producing a quantized output signal at a first output and an error output signal at a second output;
 an input adder;
 a systolic array connected to the input adder at its input side and to the quantizer at its output side;
 at least one feedback connection between the quantizer and the input adder and/or the systolic array.

In the digital sigma-delta modulator the systolic array implements a digital filter for modulator feedback.

The at least one feedback connection may be an error feedback connection connected, at its output side, to the input of the adder and/or the systolic array and, at its input side, to the second output of the quantizer, and the error feedback connection may comprise an error feedback filter having a filter transfer function $G_m(z)$.

The filter transfer function $G_m(z)$ may have the form $G_m(z)=g_1z^{-1}+g_2z^{-2}+\ldots+g_mz^{-m}$ and the coefficients $g_j$ for all $j=1,2,\ldots,m$ may be given by the equation $g_j=d_j2^{-j+1}$ where all $d_j$ are arbitrary integers.

The at least one feedback connection may be a signal feedback connection connected, at its output side, to the input of the adder and/or the systolic array and, at its input side, to the first output of the quantizer, and the signal feedback connection may comprise a signal feedback filter having a filter transfer function $H_k(z)$.

The filter transfer function $H_k(z)$ may have the form $H_k(z)=h_1z^{-1}+h_2z^{-2}+\ldots+h_kz^{-k}$ and wherein the coefficients $h_j$ for all $j=1,2,\ldots,k$ may be given by the equation $h_j=d_j2^{-j+1}$ where all $d_j$ are arbitrary integers.

The coefficients $h_1, h_2, \ldots, h_k$ may be realized by wired bit-shifts in a systolic array.

The at least one systolic array comprises a plurality of adders and flip-flops.

The coefficients $g_1, g_2, \ldots, g_m$ of the filter transfer function $G_m(z)$ are realised by wired bit-shifts in a systolic array.

The quantizer may comprise a wired unity gain mid-rise quantizer.

In the digital sigma-delta modulator correction terms may be added to the output signal and to the error signal of the internal wired quantizer by wired bit manipulation.

The quantizer may comprise a wired unity gain mid-treat quantizer.

In the digital sigma-delta modulator correction terms are added to the input signal (s) of the mid-treat quantizer and to the error signal of the internal wired quantizer by wired bit manipulation.

The digital sigma-delta modulator may operate in the frequency range between 0.4 and 12 GHz.

In a digital sigma-delta modulator as described above claims the input signal (x) may be a radio signal transmitted in a mobile communication network.

The teachings of this application are also directed to a computer-program product embodied on a computer-readable medium and comprising executable instructions for the manufacture of the digital sigma-delta modulator.

These and other aspects of the disclosed digital sigma-delta modulator or computer-program product will be apparent from and elucidated with reference to the embodiment(s) described herein after.

DETAILED DESCRIPTION OF THE INVENTION

For a complete understanding of the present invention and the advantages thereof, reference is made to the following detailed description taken in conjunction with the accompanying Figures.

It should be appreciated that the various aspects of the present invention discussed herein are merely illustrative of the specific ways to make and use the invention and do not limit the scope of invention when taken into consideration with the claims and the following detailed description and the accompanying Figures. It should be observed that features from one aspect of the invention can be combined with features from other aspects of the invention.

The entire disclosure of the article by Roncella and Saletti, of the article by Ping Wah Wong, of the article by Hossak, as well as UK patent application GB 2 408 858 A are hereby incorporated by reference into the description.

Figure 1:
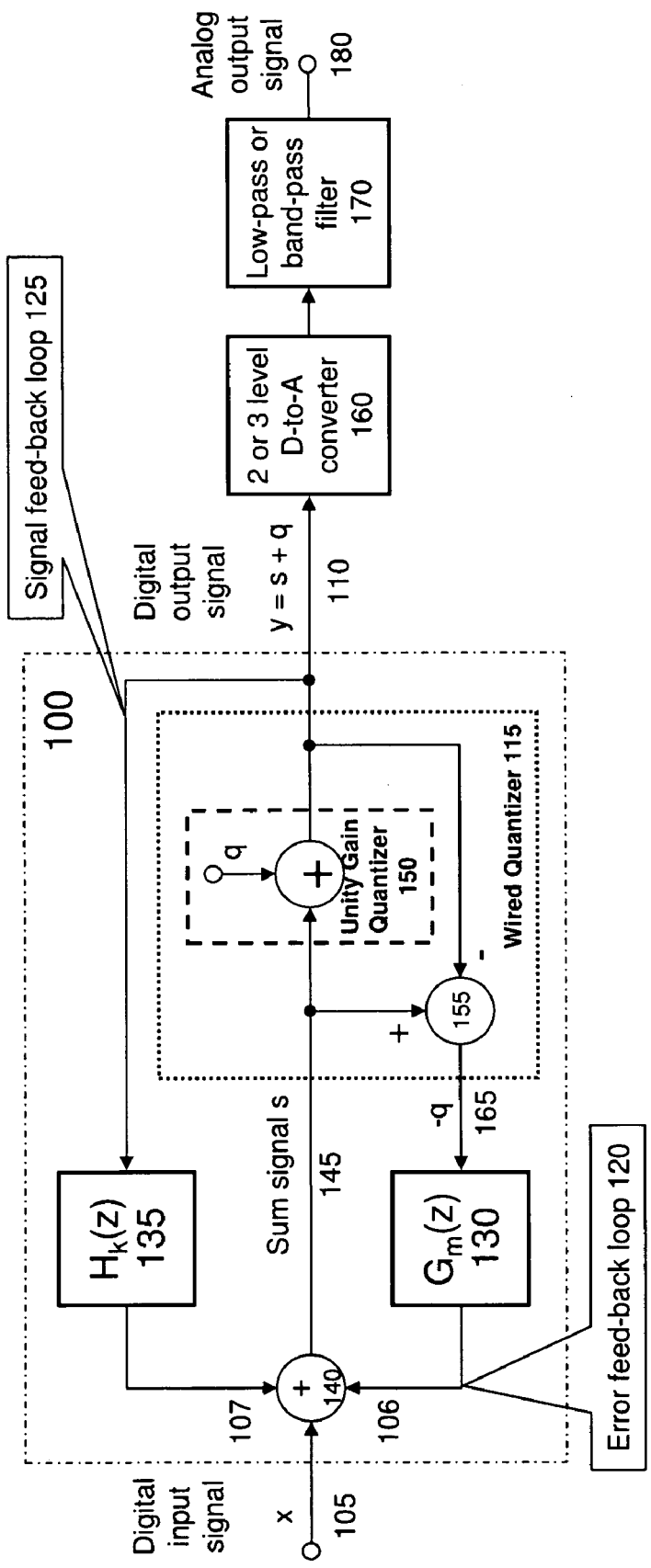
FIG. 1 shows an overview of a digital sigma-delta modulator followed by a digital-to-analog converter and an analog filter.

FIG. 1 shows an overview of a sigma-delta modulator based on quantization error feedback as is known in the art. The modulator 100 receives an oversampled digital input signal x at 105 and outputs an output signal y at 110. The modulator 100 comprises a wired quantizer 115, an error feedback loop 120 and a signal feedback loop 125. The signal feedback loop 125 has a FIR filter 135—termed the 'help filter'—having a transfer function $H_k(z)$ in the frequency domain:

$$H_k(z) = h_1 z^{-1} + h_2 z^{-2} + \ldots + h_k z^{-k} \quad \text{(Eqn. 1)}$$

in which z is the complex variable of the z-Transform and k is the order of the filter 135.

Similarly the error feedback loop 120 has a FIR filter 130—termed the 'gain filter'—having a transfer function $G_m(z)$ in the frequency domain:

$$G_m(z) = g_1 z^{-1} + g_2 z^{-2} + \ldots + g_m z^{-m} \quad \text{(Eqn. 2)}$$

It should be noted that the order k of the transfer function $H_k(z)$ may be equal to the order m of the transfer function $G_m(z)$, but m may also be different than k.

The modulator 100 includes an adder 140 at which the signal from the signal feedback loop 125 and the signal from the error feedback loop 120 is added to the input signal x to produce a sum signal s at 145. The sum signal s is passed to the wired quantizer 115.

The wired quantizer 115 comprises an unity gain quantizer 150 and a comparator 155. The noise signal q represents the quantization noise as discussed above. The comparator 155 compares the sum signal s with the output signal y of the quantizer and feeds the negative error signal −q through the error feedback loop 120 to the adder 140 as is known in the prior art as quantization error feedback.

A two or three level digital-to-analog converter 160 is connected to the digital output signal y. The digital-to-analog converter 160 is connected to a low-pass filter or a band-pass filter 170 which produces an analog output signal 180.

In the frequency domain of the z-Transform the input signal x is represented by X(z). The quantization noise signal q is represented by Q(z) and the output signal y by Y(z). Under the assumption that the quantizer function can be approximately described by a linear stage which adds a statistically independent quantization error q to the sum signal s, the transfer characteristics of the sigma-delta modulator can be described totally by linear means using the Noise Transfer Function NTF(z) and the Signal Transfer Function STF(z) as follows:

$$Y(z) = STF(z) \cdot X(z) + NTF(z) \cdot Q(z) \quad \text{(Eqn. 3)}$$

If we define the following polynomials:

$$B_m(z) = z^m [1 - G_m(z)] = z^m - g_1 z^{m-1} - g_2 z^{m-2} - \ldots - g_m \quad \text{(Eqn. 4)}$$

and $$D_k(z) = z^k [1 - H_k(z)] = z^k - h_1 z^{k-1} - h_2 z^{k-2} - \ldots - h_k \quad \text{(Eqn. 5)}$$

Then $$STF(z) = 1/(1 - H_k(z)) = z^k / D_k(z) \quad \text{(Eqn. 6)}$$

And $$NTF(z) = (1 - G_m(z))/(1 - H_k(z)) = z^{k-m} B_m(z)/D_k(z) \quad \text{(Eqn. 7)}$$

Since Sigma-Delta modulators by definition comprise one or more feedback loops, stability of the modulator is generally an issue. As known in the art Sigma-Delta modulators always perform limit cycle oscillations even in the absence of an input signal. Thus, a dedicated criterion for stability can be defined as follows:

A digital Sigma-Delta modulator is in stable operation if all the poles of the NTF(z) are located within the unit circle of the z-plane and if the sum signal s at the quantizer input does not exceed its nominal range within a boundary value at $\pm s_{limit}$.

Figures 11A, 11B:
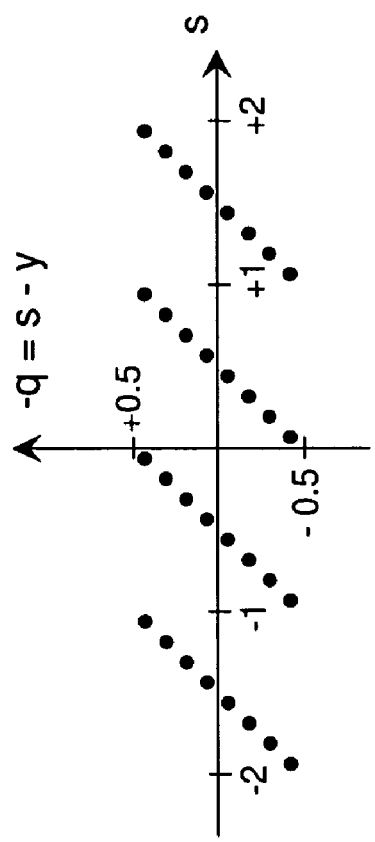
FIGS. 11a-b show the transfer characteristics of a wired unity gain mid-rise quantizer with correction terms.

For a unity gain quantizer with $2^k$ levels or k bits the boundary value is given by $s_{limit} = 0.5 \cdot 2^k$ As illustrated in FIGS. 11a-b for k=2 the amplitude of the quantization error signal q is limited to $-0.5 \leq q \leq +0.5$ as long as the sum signal s does not exceed its nominal range of $-2 \leq s \leq +2$ at the quantizer input. Similarly we define the maximal range of the modulator input signal x being limited to $-0.5 \leq x \leq +0.5$ in order to ease the following considerations.

Let us now investigate the performance and stability of the digital Sigma-Delta modulator 100 for the case in which H(z)=0. In this case there is no signal on the signal feedback loop 125 but there is a signal on the error feedback loop 120.

In this case Eqn 6 becomes STF(z)=1 (Eqn. 6a)

and

Eqn 7 becomes $NTF(z) = B_m(z)/z^m$ (Eqn. 7a).

Figure 2:
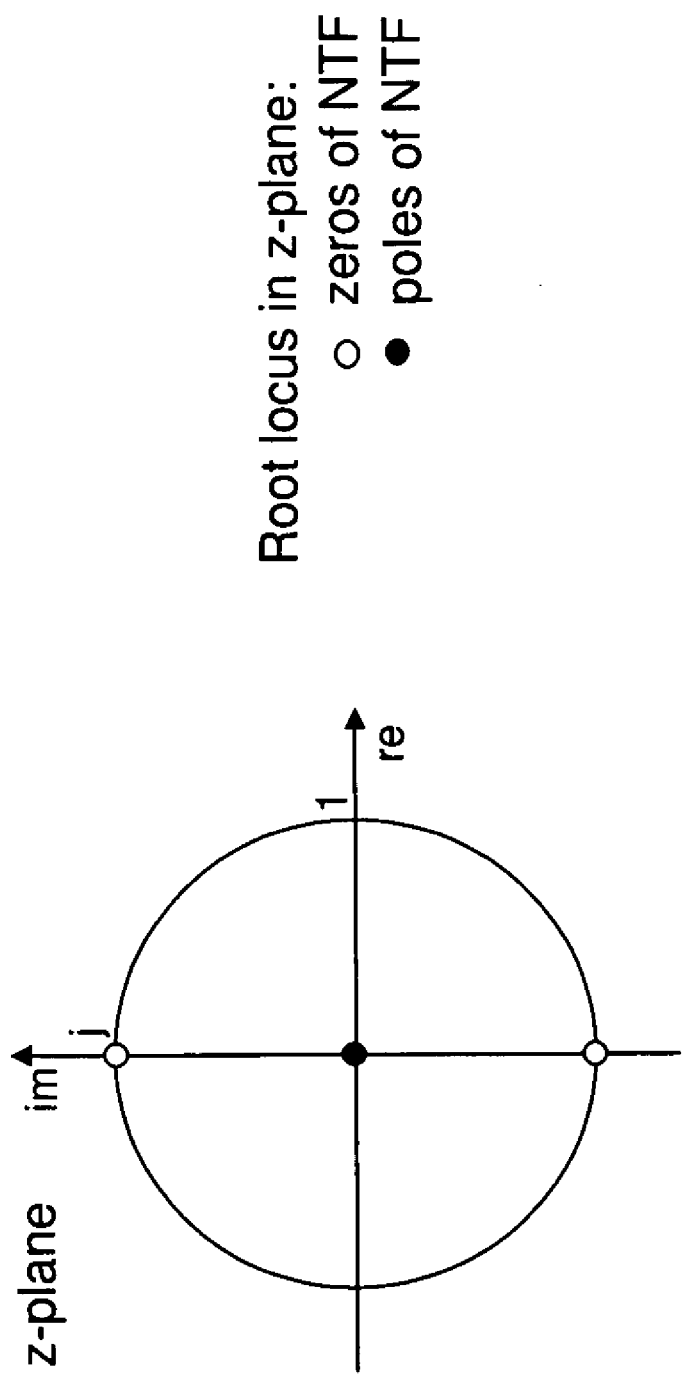
FIG. 2 shows a z-plane mapping for a digital band-pass modulator with error feedback only.
Figure 3:
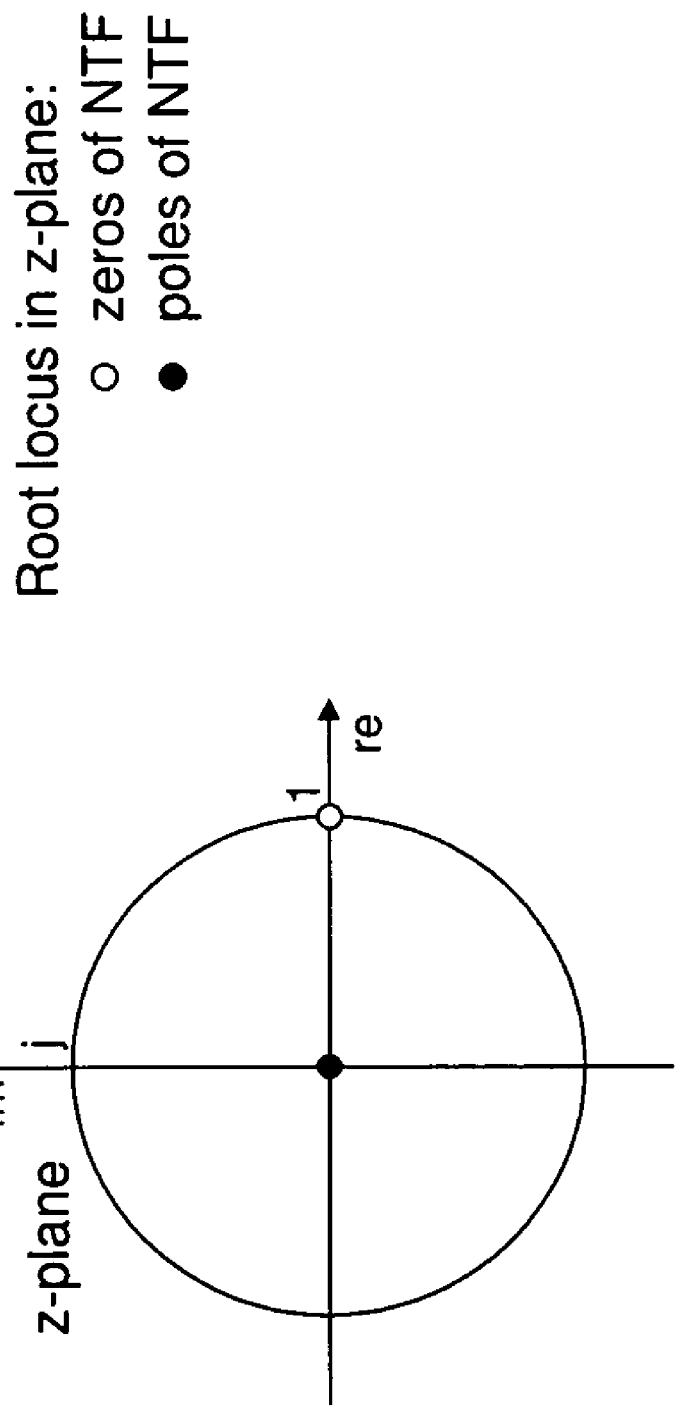
FIG. 3 shows a z-plane mapping for a digital low-pass modulator with error feedback only.

FIG. 2 shows a z-plane mapping for an example for a digital band-pass modulator and FIG. 3 shows a z-plane mapping for an example for a digital low-pass modulator. As is known suppression of the quantization noise is caused by zero values of the NTF being on the unit circle of the z-plane mapping.

Let us take some examples for a digital band-pass modulator (FIG. 2). In this case the requirement that NTF(z) be zero at z=±j can be met if the order of the gain filter is an even number (m=2,4,6 etc) and so $$B_2(z)=z^2+1 \quad \text{(Eqn. 8)}$$

$$G_2(z)=-z^{-2} \quad \text{(Eqn. 8a)}$$

$$B_4(z)=z^4+2z^2+1 \quad \text{(Eqn. 9)}$$

$$G_4(z)=-2z^{-2}-z^{-4} \quad \text{(Eqn. 9a)}$$

$$B_6(z)=z^6+3z^4+3z^2+1 \quad \text{(Eqn. 10)}$$

$$G_6(z)=-3z^{-2}-3z^{-4}-z^{-6} \quad \text{(Eqn. 10a)}$$

Under the assumption that error signal q does not exceed its nominal range of $-0.5 \leq q \leq +0.5$ whilst knowing that the modulator input signal x is limited to $-0.5 \leq x \leq +0.5$ we can calculate the maximum amplitude $s_{max}$ of the quantizer input signal s by taking use of the coefficients of FIR filter $G_m(z)$ and obtain in the band-pass case:

$$s_{max}=0.5+0.5 \cdot (2^{m/2}-1)=0.5 \cdot 2^{m/2} \quad \text{(Eqn. 10b)}$$

Thus, a digital band-pass modulator comprising only an error feedback loop with $m^{th}$ order FIR filter is unconditionally stable when equipped with an unity gain mid-rise quantizer having a scale of $2^{m/2}$ levels or m/2 bits and therefore input boundaries at $s_{limit}=\pm 0.5 \cdot 2^{m/2}$ which cannot be exceeded by the sum signal s at the quantizer input as shown by Eqn. 10b.

Similarly for the digital low-pass modulator (FIG. 3) the requirement that the NTF be zero at z=+1 can be met by any order of the gain filter (i.e. m=1, 2, 3, etc.) and so $$B_1(z)=z-1 \quad \text{(Eqn. 11)}$$

$$G_1(z)=z^{-1} \quad \text{(Eqn. 11a)}$$

$$B_2(z)=z^2-2z+1 \quad \text{(Eqn. 12)}$$

$$G_2(z)=2z^{-1}-z^{-2} \quad \text{(Eqn. 12a)}$$

$$B_3(z)=z^3-3z^2+3z-1 \quad \text{(Eqn. 13)}$$

$$G_3(z)=3z^{-1}-3z^{-2}+z^{-3} \quad \text{(Eqn. 13a)}$$

Performing a similar calculation as above we obtain for the low-pass case:

$$s_{max}=0.5+0.5 \cdot (2^m-1)=0.5 \cdot 2^m \quad \text{(Eqn. 13b)}$$

Thus, a digital low-pass modulator comprising only an error feedback loop with $m^{th}$ order FIR filter is unconditionally stable when equipped with an unity gain mid-rise quantizer having a scale of $2^m$ levels or m bits and therefore input boundaries at $s_{limit}=\pm 0.5 \cdot 2^m$ which cannot be exceeded by the sum signal s at the quantizer input as shown by Eqn. 13b.

Summarising the considerations above we can conclude that higher order digital band-pass and low-pass Sigma-Delta modulators only based on error feedback require multi-bit quantizers in order to inhibit quantizer overload and therefore guaranty stability of operation according to the criterion defined above.

Figure 4:
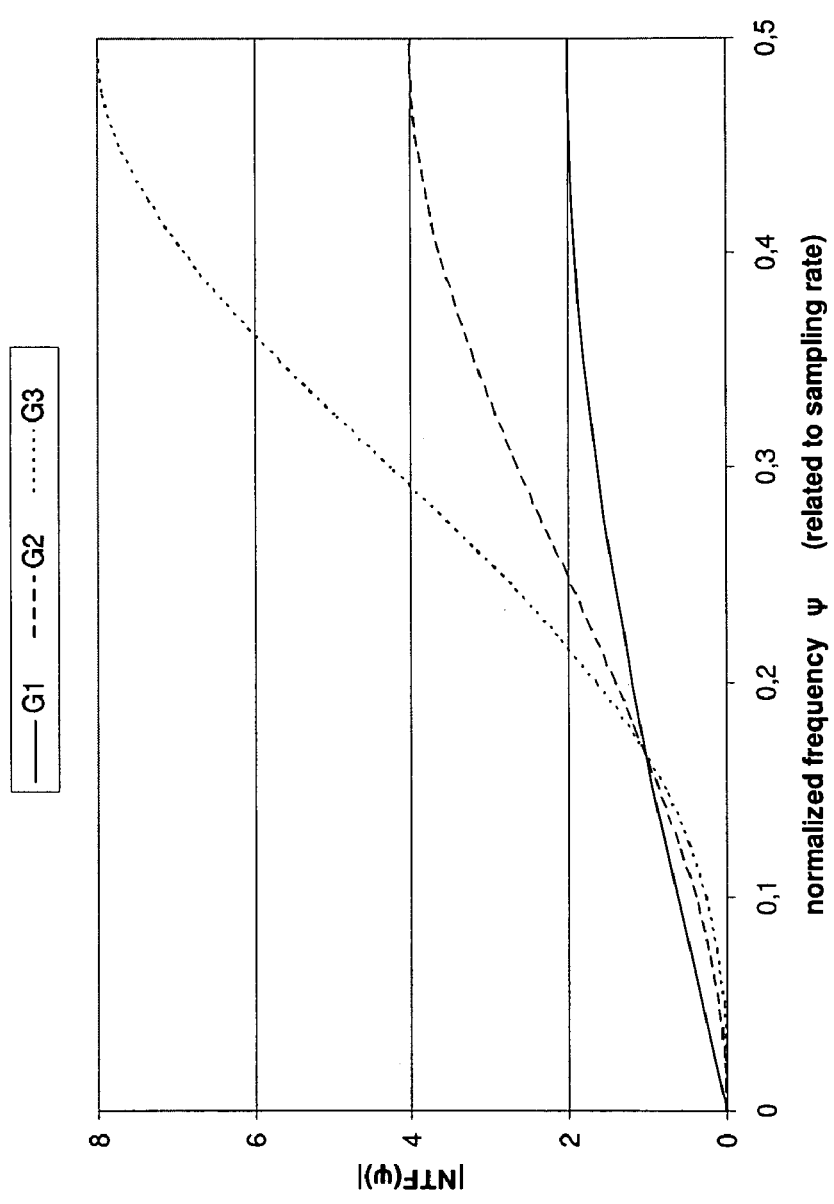
FIG. 4 shows the noise transfer function against normalized frequency for a digital sigma-delta low pass modulator without help FIR filter H(z).

This is also demonstrated by the shape of the amplitude transfer function $|NTF(z=e^{j2\pi \cdot \psi})|$ of the quantization noise plotted in FIG. 4 against normalized frequency $\Psi$ which is related to the sampling rate. The $|NTF(\psi)|$ is shown for low-pass gain filters $G_m(z)$ with m=1, 2 and 3. It can be seen from this graph that the attenuation of quantization noise in the pass-band, e.g. for $\psi \leq 0.1$ is improved by upgrading the order m of the gain filter $G_m(z)$. However, the out-of-band noise for $\psi > 0.2$ is increased by upgrading the filter order m. Thus, overload of single-bit unity gain quantizers with its low input signal boundaries ($s_{limit}=\pm 1.0$ for 2 levels as well as $s_{limit}=\pm 1.5$ for 3 levels) is obviously unavoidable with higher order gain filters even in the absence of a signal x at the modulator input.

This shows that it is advisable in a preferred embodiment of the digital sigma-delta modulator to introduce additionally a signal feedback loop 125 which comprises the help FIR filter 135 enabling stability of higher order modulators with single-bit unity gain quantizers as will be detailed below. In this case the signal feedback loop 125 is used to attenuate the out-of-band noise. The help FIR filter 135 within the signal feedback loop 125 has a transfer function $H_k(z)$ as was described above which is now non-zero.

Figure 5:
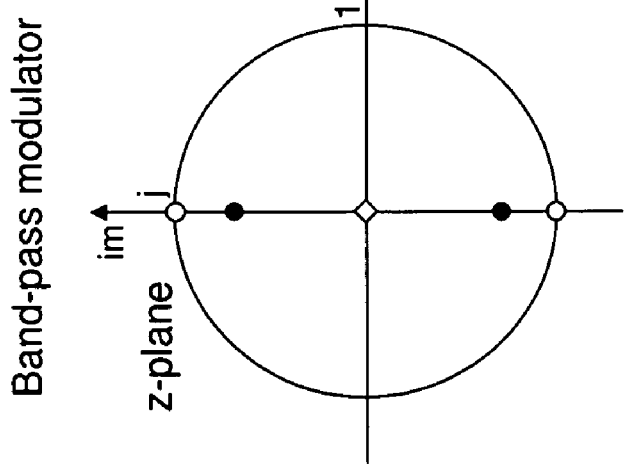
FIG. 5 shows a z plane mapping for a digital band-pass modulator and a digital low-pass modulator with an error feedback loop and a signal feedback loop.

By introducing the signal feedback loop, the poles of the NTF are displaced from the origin of the z-plane towards the NTF zeroes as can be seen in FIG. 5 for a band-pass modulator and a low-pass modulator respectively. As long as the poles remain within the unit circle of the z-plane, then the system will be stable provided that the sum signal s is not exceeding the boundary values of the quantizer input. In this case the signal transfer function STF(z) (Eqn. 6) is no longer unity as it was in the case considered above in which $H_k(z)$ was zero. Therefore the noise transfer function becomes NTF $(z)=B_m(z)/D_k(z)$.

The coefficients of the FIR filter 135 having the transfer function $H_k(z)$ will have at least partially non-integer values. The FIR filter 135 is realized in a systolic array. In order to do this, the coefficients $h_j$ need to be given under the following constraint:

$$h_j=d_j \cdot 2^{-j+1} \text{ for all } j=1, 2, \ldots k \quad \text{Eqn. 14}$$

where all $d_j$ are arbitrary integers.

Figure 6:
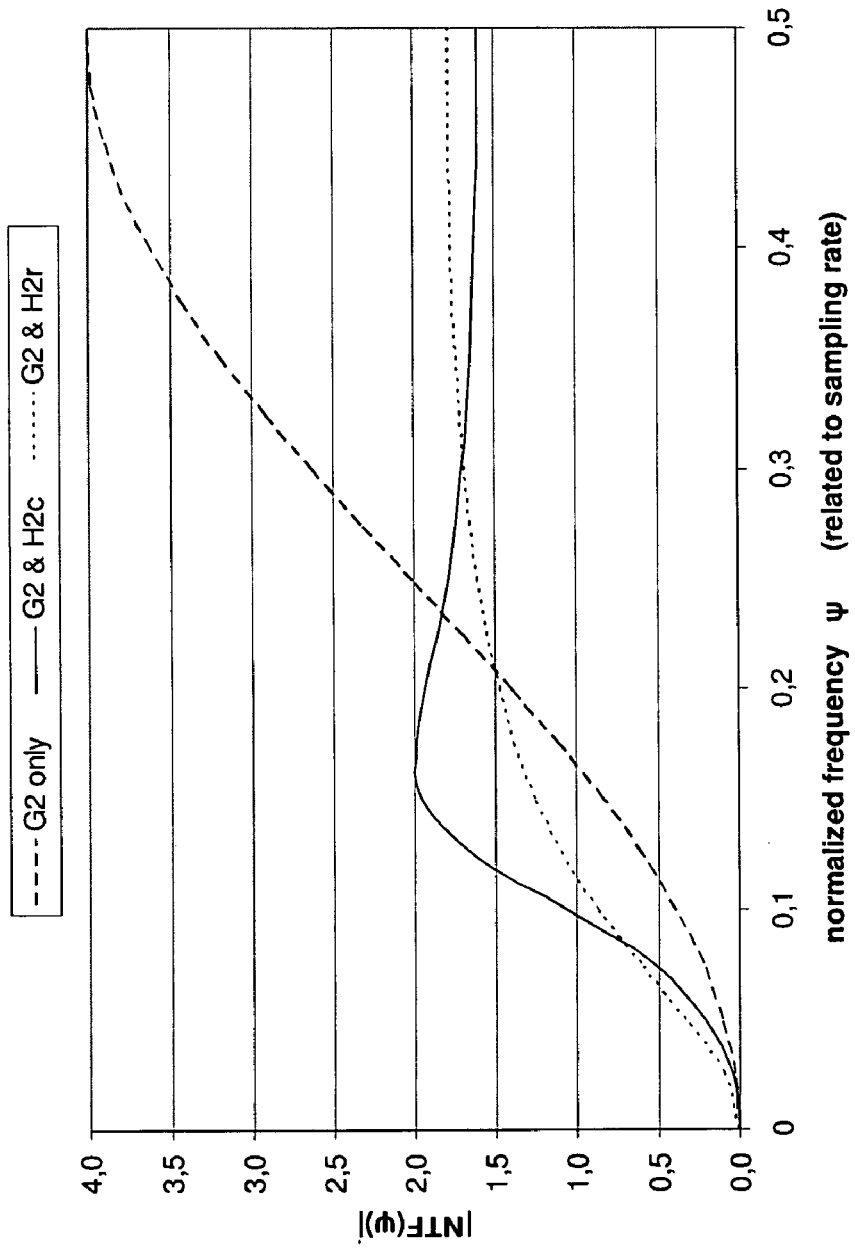
FIG. 6 shows the noise transfer function against normalized frequency for a digital sigma-delta low pass modulator with and without a FIR filter in the signal feedback loop having different transfer functions H(z).

The effect of introducing the signal feedback loop 125 is shown in FIG. 6 which illustrates the attenuation of the out-of-band noise using two different help FIR filters within a $2^{nd}$ order low-pass Sigma-Delta modulator. In this case k=m=2 and thus $$G_2(z)=2 \cdot z^{-1}-z^{-2} \quad \text{Eqn. 15 (from Eqn. 2 with m=2)}$$

$$H_{2c}(z)=z^{-1}-\tfrac{1}{2} \cdot z^{-2} \quad \text{Eqn. 16a (from Eqn. 1 with k=2)}$$

$$H_{2r}(z)=z^{-1}-\tfrac{1}{4} \cdot z^{-2} \text{ is} \quad \text{Eqn. 16b (from Eqn. 1 with k=2)}$$

Only in case of Eqn. 15 and 16a are the values of $d_j$ integers for all j=1,2 (as required by Eqn. 14), thus, $G_2(z)$ and $H_{2c}(z)$ can be realized in a systolic array.

FIG. 6 shows the noise amplitude transfer function $|NTF(\psi)|$ of the $2^{nd}$ order low-pass modulator against normalized frequency $\psi$ with and without the signal feedback loop 125. This figure shows that the noise amplitude transfer function is significantly reduced to be $|NTF(\psi)| \leq 2$ when the signal feedback loop 125 is introduced and therefore comparable to the NTF form shown in FIG. 4 for the $1^{st}$ order low-pass Sigma-Delta modulator having only an error feedback loop with gain filter $G_1$ which runs stable with a single-bit unity gain quantizer. Thus, it could be demonstrated that introducing the signal feedback loop 125 helps to stabilize higher order Sigma-Delta modulators with single-bit unity gain quantizers.

If the help filter transfer function $H_{2r}(z)$ is used instead of $H_{2c}(z)$ then the form of the noise amplitude transfer function $|NTF(\Psi)|$ of the modulator will become more attenuated in the out-of-band range $0.1 \leq \psi \leq 0.3$ as shown in FIG. 6. However, there is no integer value of $d_2$ in Eqn. 14 which will give a coefficient $h_2=\frac{1}{4}$. As a result it is not possible to realize this help filter transfer function $H_{2r}(z)$ in a systolic array.

The building blocks for a systolic Sigma-Delta modulator will now be described.

Figure 7:
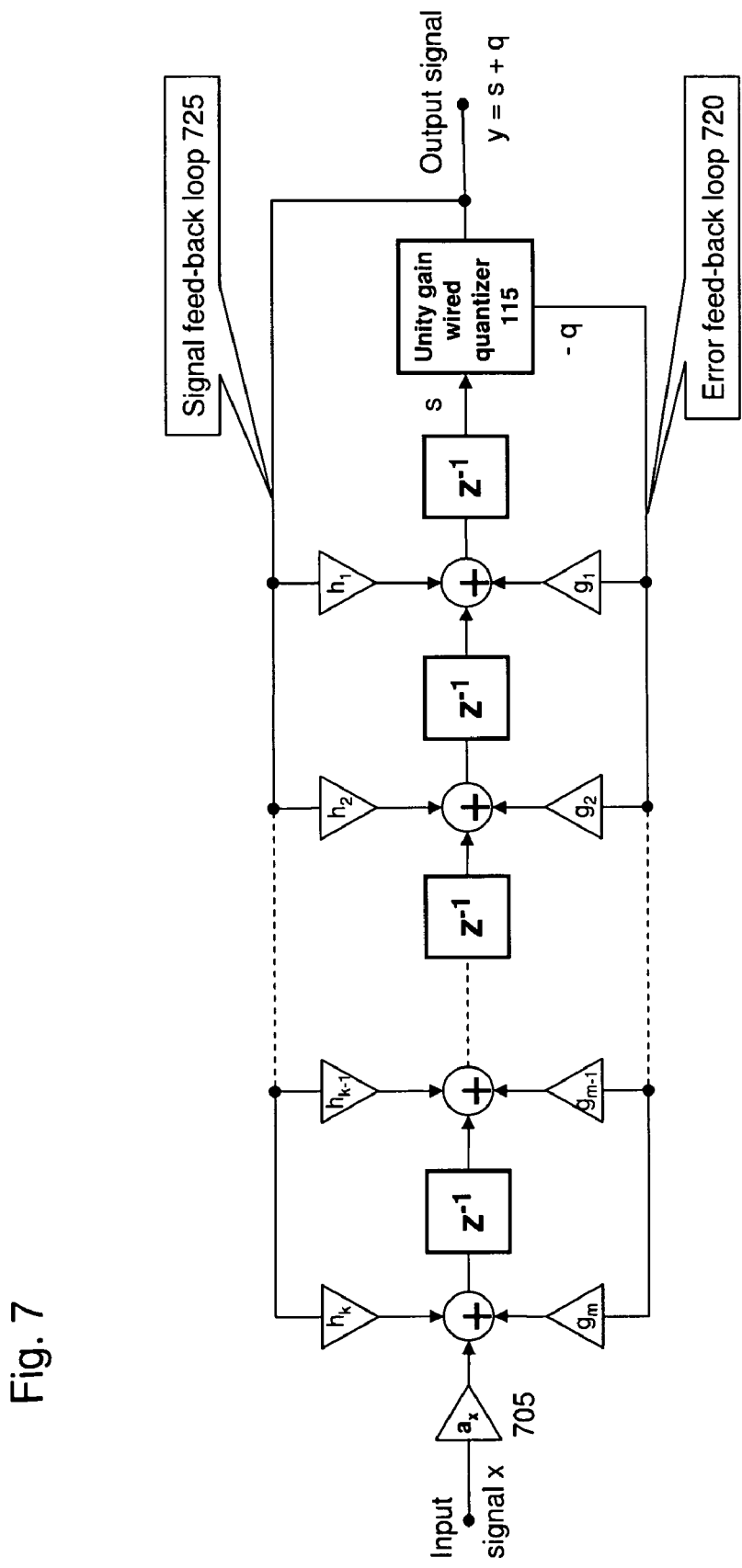
FIG. 7 shows the building blocks for an arbitrary digital low-pass or band-pass sigma-delta modulator with loop FIR filters $G_m(z)$ and $H_k(z)$ supporting systolic realisation.
Figure 16:
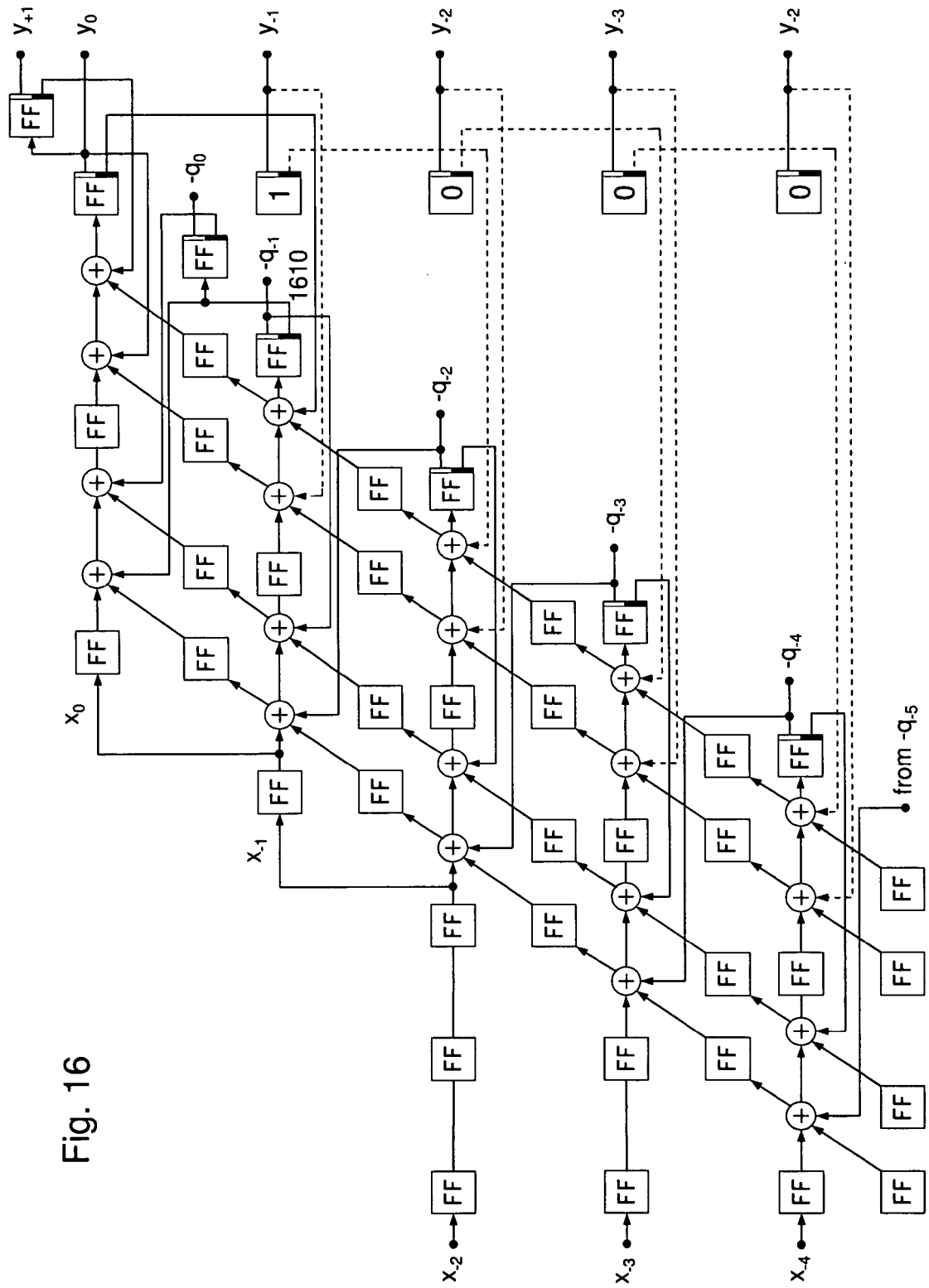
FIG. 16 shows the complete systolic realisation of a digital low-pass sigma-delta modulator for a 3 bit input signal x with loop FIR filters $G_2(z)$ and $H_2(z)$ and a wired unity gain mid-rise single-bit quantizer with correction terms providing the error signal −q and the output signal y.

FIG. 7 shows a block diagram representing an arbitrary digital Sigma-Delta modulator which can be realised in a systolic array provided that all filter coefficients $g_j$ and $h_j$ fulfil the requirement of Eqn. 14. In this context systolic realisation denotes a 2-dimensional pipelining in the flow direction of the signal bits (i.e. "horizontal pipelining") as well as in the flow direction of the carry bits (i.e. "vertical pipelining"). By definition, a "systolic array" comprises only one-bit full adders, flip-flops and wiring as depicted in FIG. 16.

The input signal x is attenuated in the attenuator 705 by a factor of $a_x$, to compensate for pass-band amplification caused by the filter transfer function $H_k(z)$. The circuit shown in FIG. 7 can be realised exclusively by the use of D flip-flops, full adders and wiring. The coefficients of the FIR filters in the signal feedback loop 725 and the error feedback loop 720 are to be realised each as a sum of powers of 2. This enables multiplication by wired bit shifts.

The systolic realization is based on two's complement arithmetic. Using two's complement arithmetic a value A can be represented as follows:

| MSB | LSIB | MSFB | LSB | RNB | LSB Extension |
|---|---|---|---|---|---|
| Value A $a_2$ | $a_1$ | $a_0$ $a_{-1}$ $a_{-2}$ $\cdots a_{-n}$ | 1 | 0 | 0   0 ... | in which the bit index n denotes $\log_2$ of the bit level, i.e. when bit $a_1$, is set it represents the value of $2^{+1}=2$.

MSB is the Most Significant Bit representing the sign of value A. A is negative when the MSB is set to a value of 1 and positive when the MSB is cleared, i.e. set to a value of 0. LSIB is the Least Significant Integer Bit representing the value of 1 when the LSIB is set. MSFB is the Most Significant Fractional Bit representing the value of 0.5 when the MSFB is set and finally LSB is the Least Significant Bit representing the value of $2^{-n}$ when the LSB is set.

Furthermore a Representative Notation Bit (RNB) is included and optionally followed by zeros which together can be interpreted as "LSB extension". The number of zeros is dependent on word length and thus on the implementation of the systolic array. The RNB is always set to a value of 1 representing the constant value of $2^{-(n+1)}$ together with the following zeros. This representative level notation achieved by LSB extension is essential for enabling a systolic implementation because it inhibits the so called "carry ripple through effect". As known in the art this effect normally occurs when in two's complement arithmetic a codeword is negated.

When representative level notation by LSB extension is provided a given codeword for A can simply be negated by inverting all the bits from MSB to LSB whilst the LSB extension bits remain unchanged. In this case the value of –A is given by Negative filter coefficients $h_k$ and $g_m$ can then be realised using this notation as will be discussed later.

Figure 8:
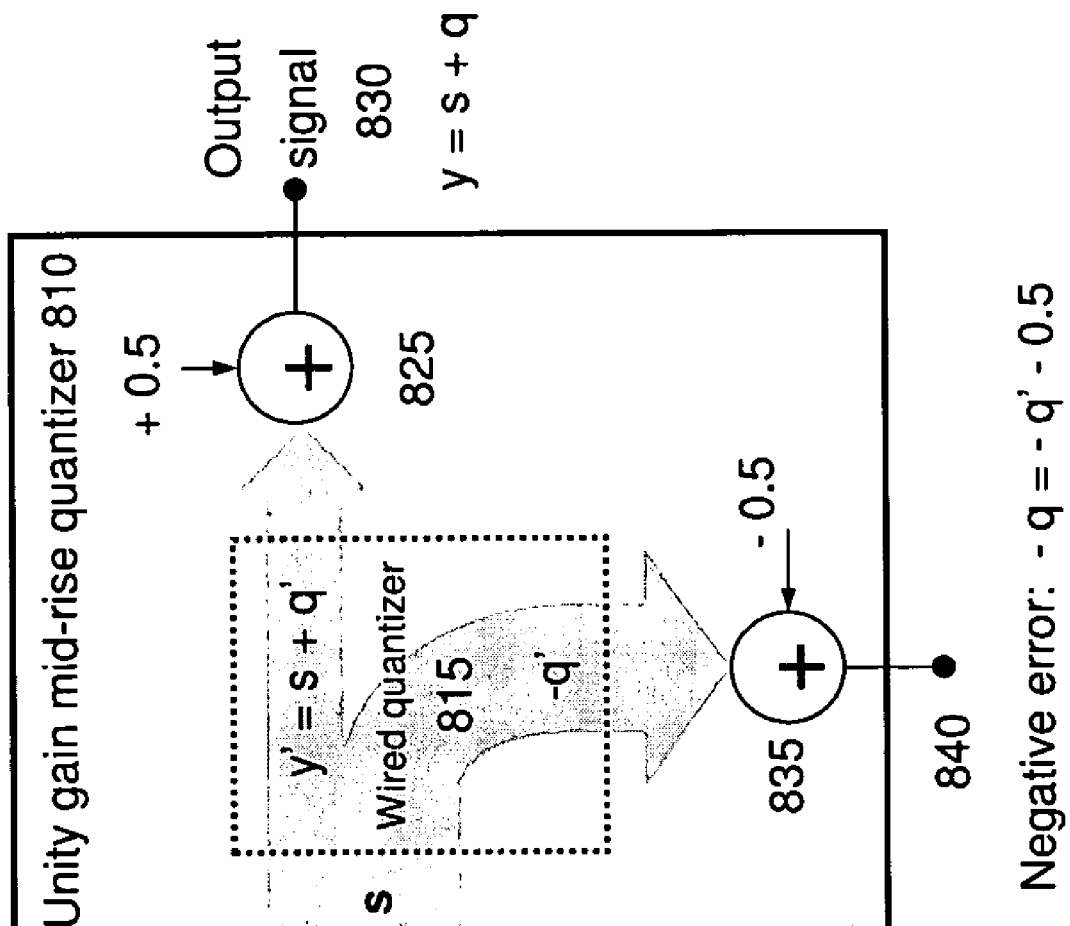
FIG. 8 shows a wired unity gain mid-rise quantizer with correction terms.

FIG. 8. shows the realisation of an unity gain mid-rise quantizer 810 using internally a wired quantizer 815 and having an input signal s at 820. The wired quantizer 815 is simply realised by sub-dividing the bits of signal s into two partitions. The quantized signal y' comprises the upper bits representing all integer values whereas the negative quantization error-signal –q' comprises the lower bits with its MSFB representing the value of 0.5 when the MSFB is set.

Figure 10A:
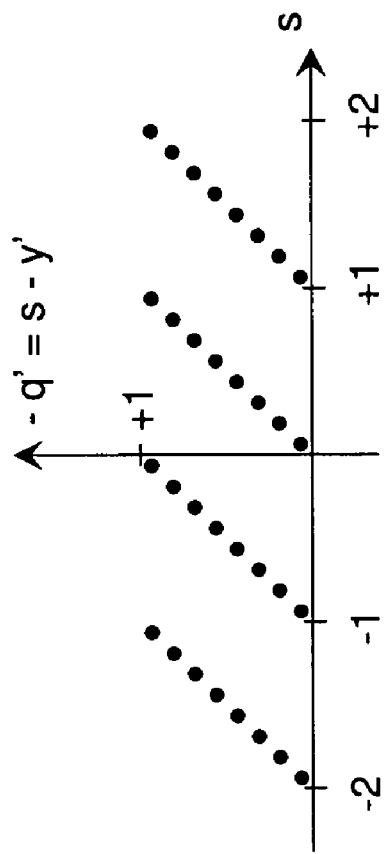
FIGS. 10a-b show the transfer characteristics of a wired unity gain mid-rise quantizer without correction terms.
Figure 10B:
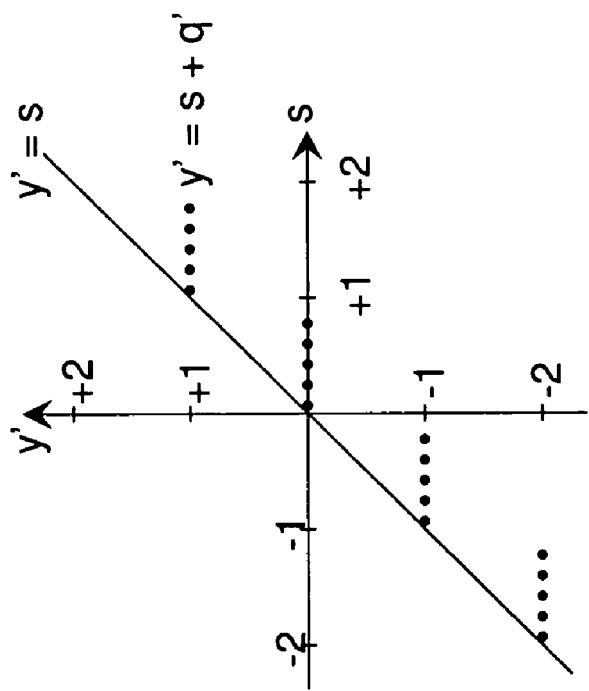

FIGS. 10*a*-10*b* show the signal transfer characteristics of the internal wired quantizer 815 having two output signals y' and –q' which both contain a DC offset. The DC offset is compensated by adding corrective terms to output signals y' and –q'. A corrective term of –0.5 is added to signal –q' in adder 835 yielding a DC free negative quantization error signal –q at 840. Further, a corrective term of +0.5 is added to signal y' in adder 825 yielding the DC free output signal y at 830. The sum of the two output signals y and –q of the unity gain mid-rise quantizer 810 equals the input signal s. Thus the correction remains neutral regarding all signals outside of the quantizer 810 and we obtain $$y = s + q \quad \text{(Eqn. 17)}$$

FIGS. 11*a*-11*b* show the signal transfer characteristics of the unity gain mid-rise quantizer 810 without any DC offset.

The corrective additions are simply carried out by wired bit manipulations using the representative level notation in two's complement arithmetic (as discussed above) in which the value of 0.5 is represented by a bit at index –1 being set. Thus, the corrective adding of +0.5 to signal y' is realised by the LSB extension whilst the corrective adding of –0.5 to signal –q' is realised by inverting the MSFB of signal –q' plus sign extension to the word length of signal s.

Figure 12:
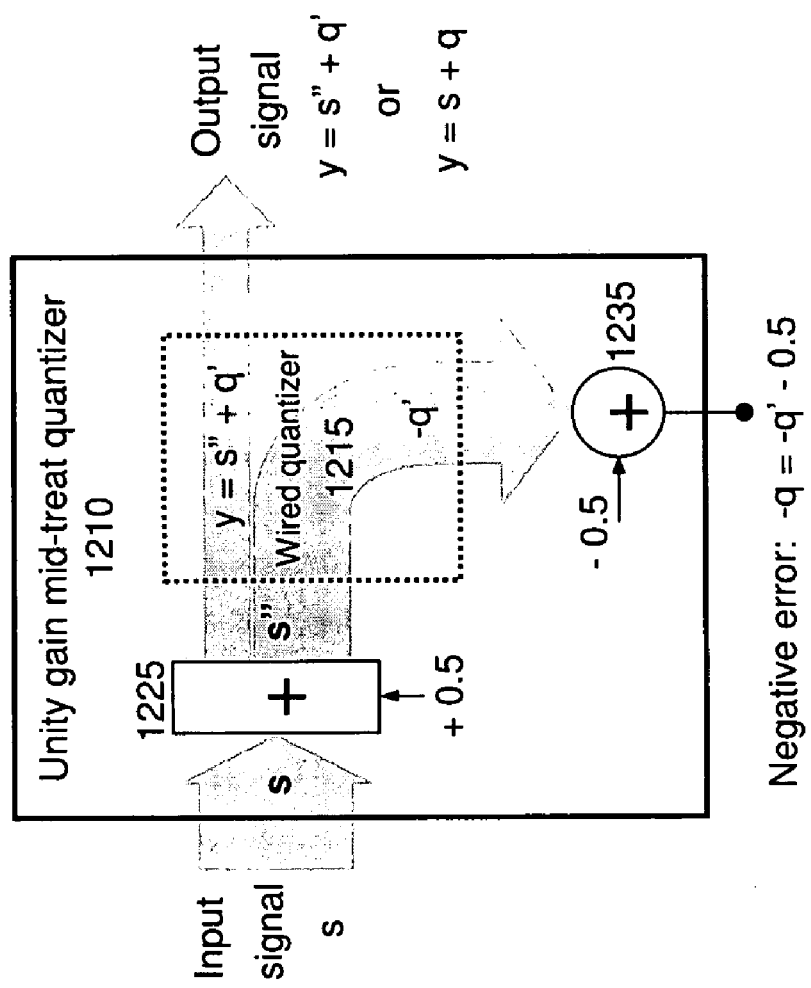
FIG. 12 shows a wired unity gain mid-treat quantizer with correction terms.

Similar considerations apply to a mid-treat quantizer 1210 as is shown in FIG. 12. The mid-treat quantizer differs from the mid-rise quantizer in that a corrective term of +0.5 is added by the adder 1225 to the input signal s yielding signal s" which is quantized by the internal wired quantizer 1215. This corrective addition creates the required signal transfer characteristic of a mid-treat quantizer by transforming the graph of FIG. 10*a* into the graph of FIG. 13*a* which is DC free.

Figure 13B:
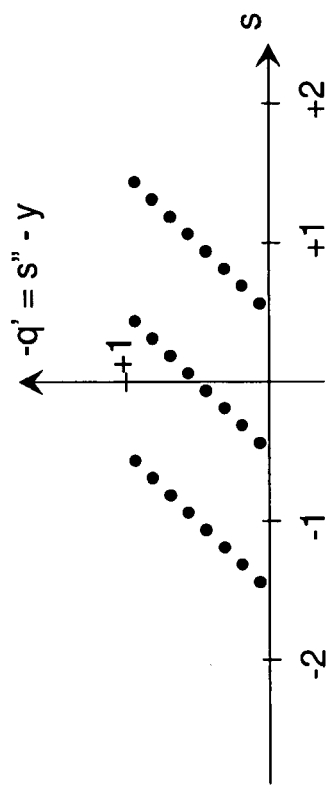
FIGS. 13a-c show the transfer characteristics of a wired unity gain mid-treat quantizer with and without correction terms.
Figure 13C:
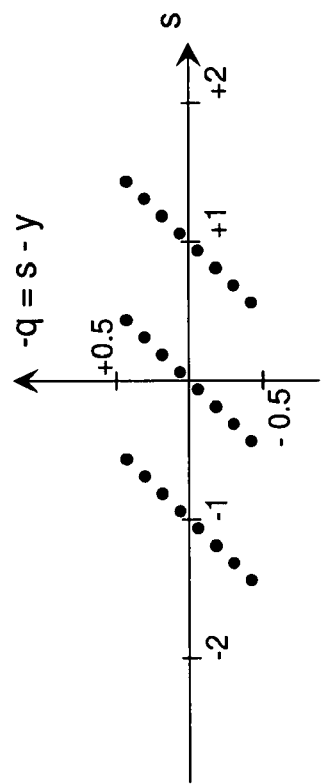
Figure 13A:
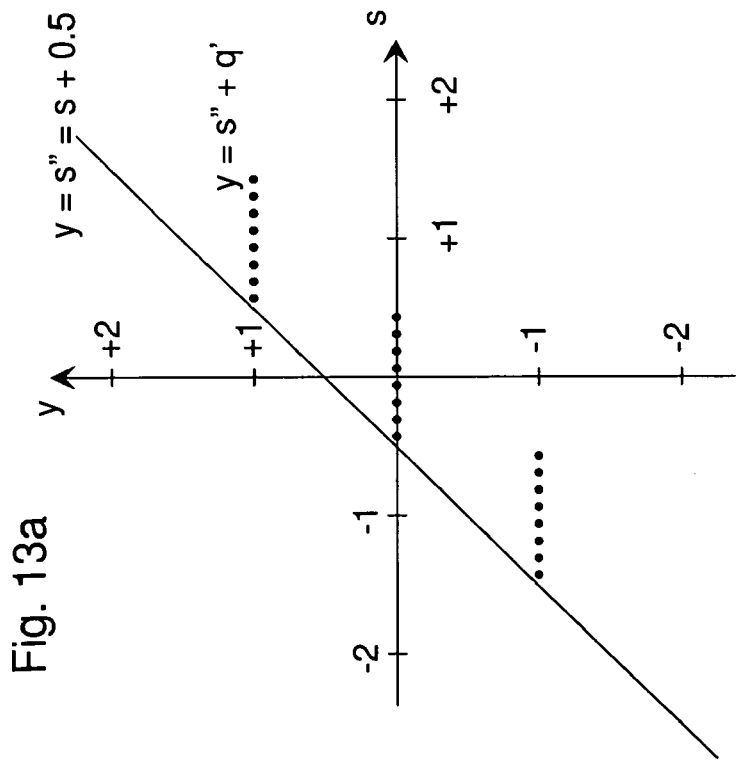

However, the $2^{nd}$ output signal –q' of the internal wired quantizer 1215 still contains a DC offset as shown in FIG. 13*b*. This offset is compensated by adding the corrective term of –0.5 to signal –q' in adder 1235 yielding a DC free negative quantization error signal –q as shown by the signal transfer characteristic depicted in FIG. 13*c*. These corrective additions can also be carried out by wired bit manipulations (as discussed above).

Figure 9:
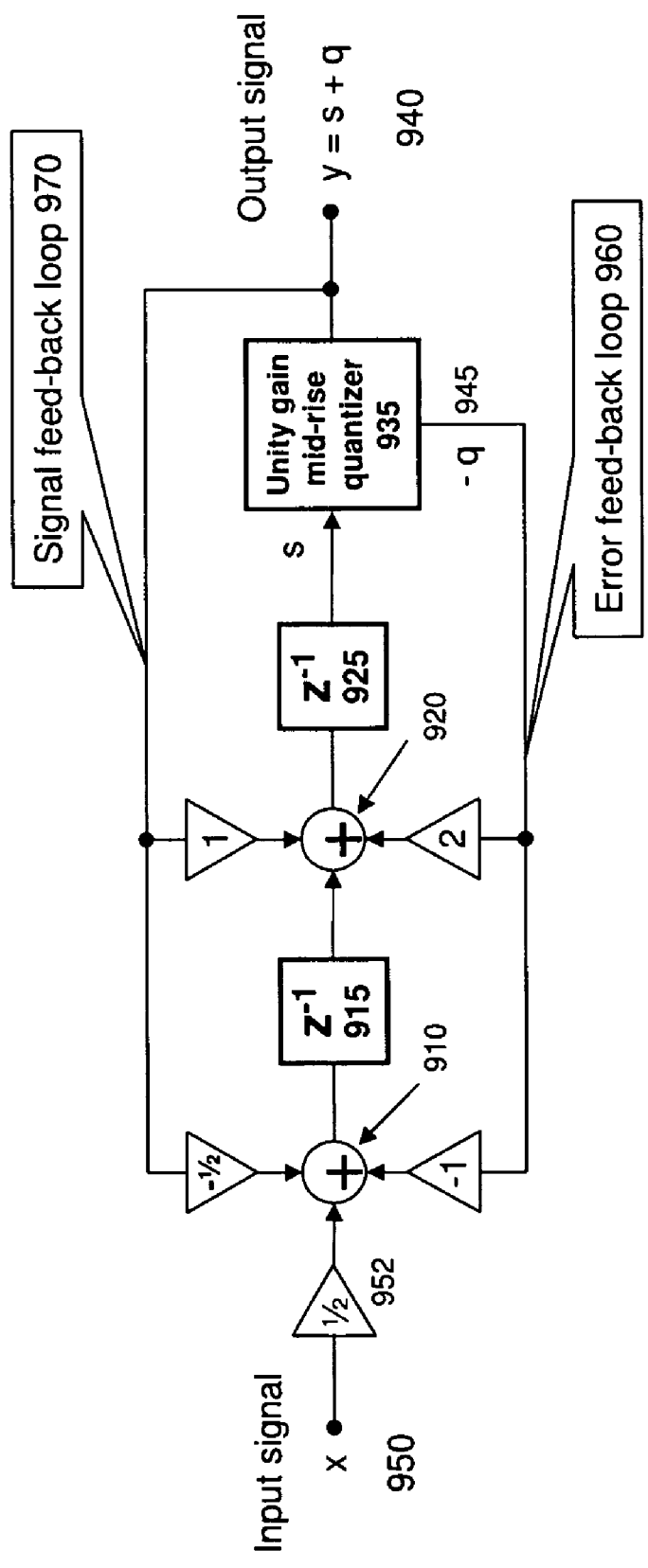
FIG. 9 shows the building blocks for a digital low-pass sigma-delta modulator with loop FIR filters $G_2(z)$ and $H_2(z)$ enabling systolic realisation.

The systolic realization of a $2^{nd}$ order digital low-pass Sigma-Delta modulator will now be described in detail based on the block diagram as depicted in FIG. 9. This modulator uses a gain FIR filter with transfer function $G_2(z) = 2 \cdot z^{-1} - z^{-2}$ in the error feedback loop 960 (error feedback connection) and a help FIR filter with transfer function $H_2(z) = z^{-1} - \frac{1}{2} \cdot z^{-2}$ in the signal feedback loop 970 (or signal feedback connection) together with a single-bit unity gain mid-rise quantizer 935. A signal x is input at 950. The input signal x is attenuated

| MSB | LSIB | MSFB | LSB | RNB | LSB Extension |
|---|---|---|---|---|---|
| Value –A $\bar{a}_2$ | $\bar{a}_1$ | $\bar{a}_0$ $\bar{a}_{-1}$ $\bar{a}_{-2}$ $\cdots \bar{a}_{-n}$ | 1 | 0 | 0   0 ... | by ½ at the attenuator 952 to compensate for the pass-band amplification caused by the signal amplitude transfer function |STF (z=1)|=2 of the modulator.

The attenuated input signal ½·x is passed to adder 910 at which point an inverted error signal −q is added and −½ of y is added. The filter coefficient of ½ is realised by a bit shift. The negative coefficient is achieved by inverting all the significant bits of signals −q and y, but the LSB extension bits remain unchanged. The resulting sum signal then is delayed by register 915 having the transfer function $z^{-1}$ and forwarded to adder 920 which adds twice −q and y before being delayed by a further register 925 to produce a sum signal s. A wired mid-rise quantizer 935 provides an output signal y=s+q 940 (explained above) and an error signal −q at 945 which is fed back to the adders 910 and 920 as described above.

The filter coefficient 2 as an input to the adder 920 and the filter coefficient −½ as an input to the adder 910 are executed by bit shifting the words representing the signals y and −q. The negative filter coefficients are realized by inverting all the significant bits of −q and y, but leaving the LSB extension bits unchanged prior to execute the abovementioned wired bit shifts.

The modulator structure as shown in FIG. 9 is advantageous over conventional modulator structures since it allows the realization of the modulator in a systolic array.

Figure 14:
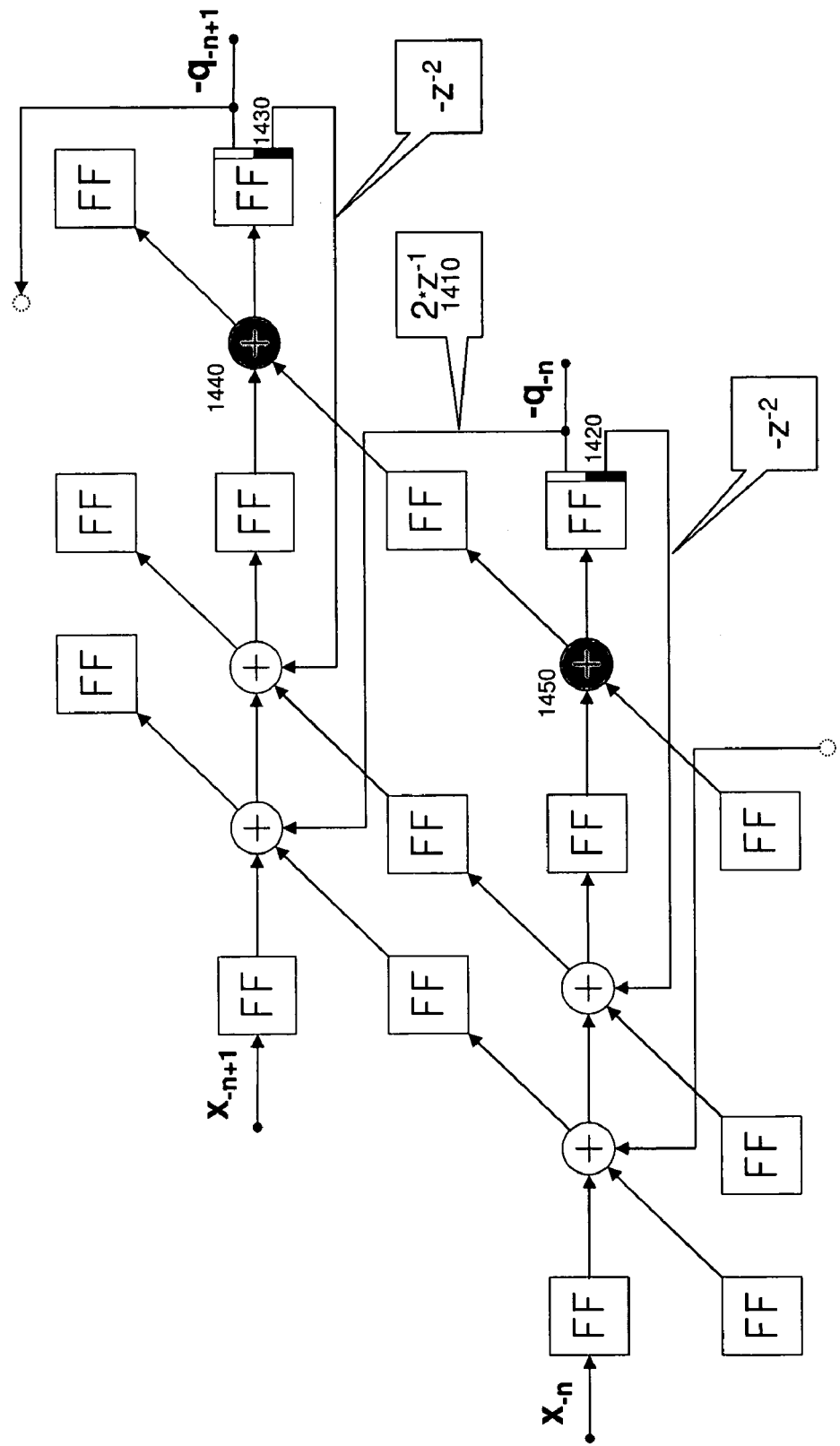
FIG. 14 shows partly the systolic realisation of gain filter $G_2(z)$ within an error feedback loop for two bit slices.

FIG. 14 shows partly for two bit-slices the realization of the $2^{nd}$ order filter transfer function $G_2(z)$ in a systolic array made of full adders and edge triggered D flip-flop (denoted by FF). This realization is scalable to any word length of signals x and s. In FIG. 14 $x_{-n}$ and $x_{-n+1}$ as well as $-q_{-n}$ and $-q_{-n+1}$ signify the bits at levels $2^{-n}$ and $2^{-n+1}$ of the signals x and −q respectively. As discussed above the indices −n, −n+1 denote $\log_2$ of the levels represented by the respective bits of input signal x and error signal −q. It will be seen in the bottom right of the graph that the coefficient 2 is realized by a wired bit shift 1410.

The negative coefficients are achieved by using the inverted outputs of the D flip-flops as can be seen at 1420 and 1430. Adders 1440 and 1450 are provided to add the output signals of $G_2(z)$ and $H_2(z)$ as will be discussed below.

Figure 15:
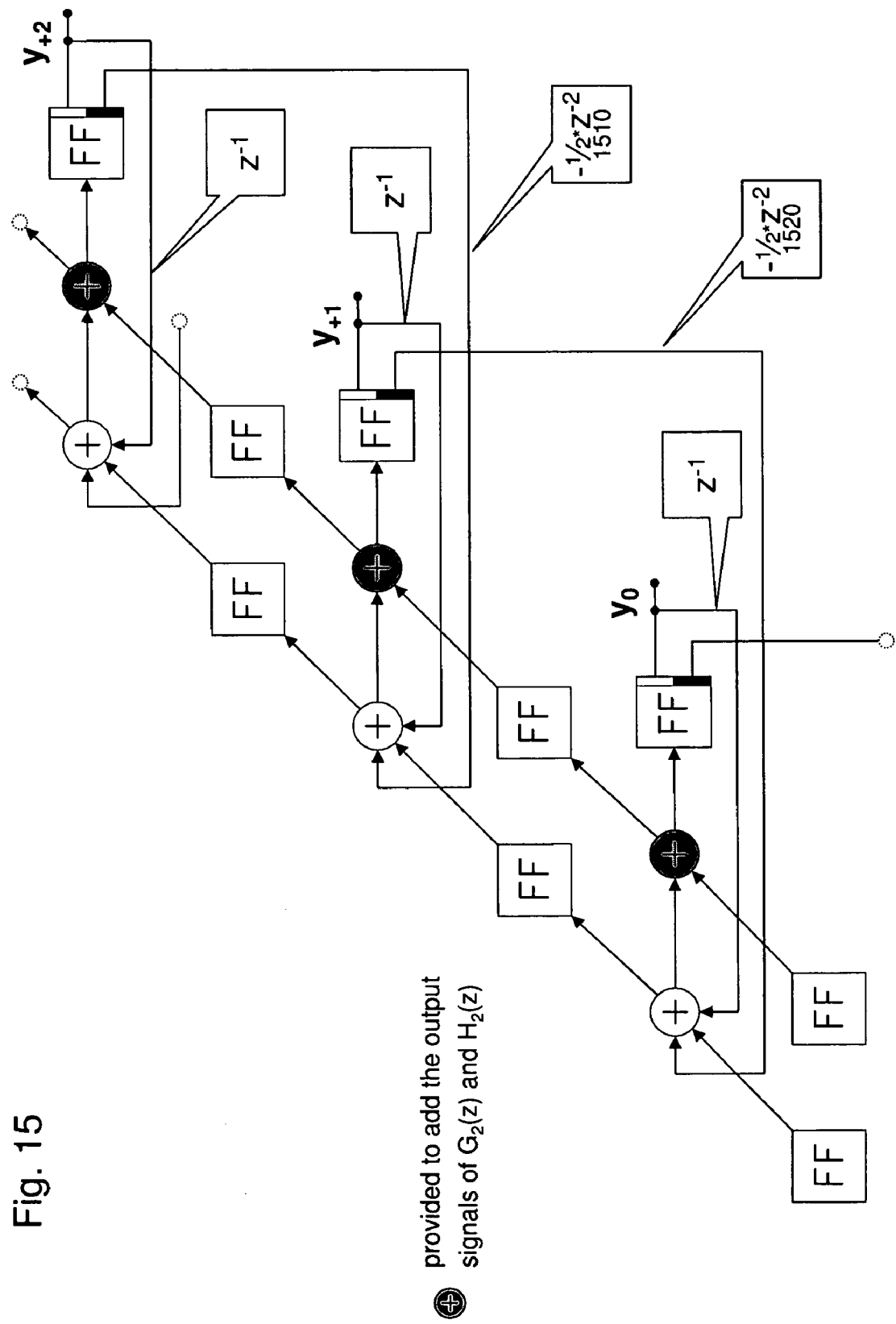
FIG. 15 shows partly the systolic realisation of help filter $H_2(z)$ within a signal feedback loop for three bit slices.

Similarly FIG. 15 shows partly for three bit-slices the systolic realization of the $2^{nd}$ order filter transfer function $H_2(z)=z^{-1}-\frac{1}{2}\cdot z^{-2}$ which is also made from edge-triggered D flip-flops and adders. It will be seen that the coefficient of −½ is realized by a wired bit-shift at 1510 and 1520 and by using the inverted outputs of the respective D flip-flops. The indices 0, +1, +2 denote $\log_2$ of the levels represented by the respective bit of the output signal y, e.g. $y_0$ represents the level $2^0=1$.

Combining the circuits of FIG. 14 and FIG. 15 leads to the circuit of FIG. 16 which is a systolic realisation of the $2^{nd}$ order digital low-pass Sigma-Delta modulator using the feedback loop filter transfer functions $G_2(z)$ and $H_2(z)$ together with a single-bit unity gain quantizer.

The Most Significant Bit of the output signal is $y_0$. The Most Significant Bit of the quantization error is $-q_{-1}$ which is inverted by exchanging the flip-flop outputs at 1610 in order to add the correction term −0.5 for a DC free signal −q. The Most Significant Bit of the input signal is $x_{-2}$. Signals $y_0$, x and −q are sign extended according to the rules of the two's complement arithmetic as known in the art. The dashed lines on the diagram represent static signals which add the correction term 0.5 by LSB extension being mandatory for the representative level notation of the output signal y.

The systolic structure is extendable to any required word length of signal x and arbitrary orders of the feedback filters 130 and 135. The signal bits are processed in several bit-slices which are clocked synchronously but are mutually delayed due to the pipelining of the carry bits. As a result the input signal bits must be delayed by a triangular array of flip-flops. The structure can be clocked at an extremely high clock rate due to the low delay times at the one-bit adders.

While various embodiments of the disclosed digital sigma-delta modulator and computer-program product have been described above, it should be understood that they have been presented by way of example, and not limitation. It will be apparent to persons skilled in the relevant arts that various changes in form and detail can be made therein without departing from the scope of what is taught. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the disclosed digital sigma-delta modulator may include methods of providing the apparatus described herein by providing software describing the apparatus and subsequently transmitting the software as a computer data signal over a communication network including the Internet and intranets.

It is understood that the sigma-delta modulator described herein may be included in a semiconductor intellectual property core, such as a microprocessor core (e.g., embodied in HDL) and transformed to hardware in the production of integrated circuits. Additionally, the sigma-delta modulator described herein may be embodied as a combination of hardware and software. Thus, what is taught should not be limited by any of the above-described exemplary embodiments, but should be defined only in accordance with the following claims and their equivalents.

The invention claimed is:

1. A digital sigma-delta modulator for modulating a digital input signal (x) comprising:
   a quantizer for quantizing a sum signal (s) and producing a quantized output signal (y) at a first output and an error output signal (−q) at a second output;
   at least one feedback loop connected to an input adder and to at least one of the first output or the second output of the quantizer;
   whereby the input adder produces the sum signal (s) by adding the digital input signal (x) at an input and output signals of the at least one feedback loop; and
   a feedback filter in the at least one feedback loop, whereby the digital sigma-delta modulator is constructed as a systolic array.

2. The digital sigma-delta modulator according to claim 1, wherein the at least one feedback loop is an error feedback loop connected to the input of the adder and the second output of the quantizer and the error feedback loop comprises an error feedback filter having a filter transfer function $G_m(z)$.

3. The digital sigma-delta modulator of claim 2 wherein the filter transfer function $G_m(z)$ has the form $G_m(z)=g_1z^{-1}+g_2z^{-2}+\ldots+g_mz^{-m}$ and wherein the coefficients $g_j$ for all $j=1, 2, \ldots, m$ are given by the equation $g_j=d_j2^{-j+1}$ where all $d_j$ are arbitrary integers.

4. The digital sigma-delta modulator of claim 3, wherein the coefficients $g_1, g_2, \ldots, g_m$ of the filter transfer function $G_m(z)$ are realised by wired bit-shifts in a systolic array.

5. The digital sigma-delta modulator according to claim 1, wherein the at least one feedback loop is a signal feedback loop connected to the input of the adder and the first output of the quantizer and the signal feedback loop comprises a signal feedback filter having a filter transfer function $H_k(z)$.

6. The digital sigma-delta modulator of claim 5 wherein the filter transfer function $H_k(z)$ has the form $H_k(z)=h_1z^{-1}+h_2z^{-2}+\ldots+h_kz^{-k}$ and wherein the coefficients $h_j$ for all $j=1, 2, \ldots, k$ are given by the equation $h_j=d_j2^{-j+1}$ where all $d_j$ are arbitrary integers.

7. The digital sigma-delta modulator of claim 5 wherein the coefficients $h_1, h_2, \ldots, h_k$ are realized by wired bit-shifts in a systolic array.

8. The digital sigma-delta modulator of claim 1, wherein the at least one feedback filter comprises a plurality of adders and flip-flops (FF).

9. The digital sigma-delta modulator of claim 1 wherein the quantizer comprises a wired unity gain mid-rise quantizer.

10. The digital sigma-delta modulator of claim 9 wherein correction terms are added to the output signal (y') and to the error signal (−q') of the internal wired quantizer by wired bit manipulation.

11. The digital sigma-delta modulator of claim 1 wherein the quantizer comprises a wired unity gain mid-treat quantizer.

12. The digital sigma-delta modulator of claim 11, wherein correction terms are added to the input signal (s) of the mid-treat quantizer and to the error signal (−q') of the internal wired quantizer by wired bit manipulation.

13. The digital sigma-delta modulator of claim 1 operating in the frequency range between 0.4 and 12 GHz.

14. The digital sigma-delta modulator of claim 1 wherein the input signal (x) is a radio signal transmitted in a mobile communication network.

15. An digital-to-analog converter having a digital sigma-delta modulator of claim 1.

16. A computer program product embodied on a computer-readable medium and comprising executable instructions for the manufacture of the digital sigma-delta modulator of claim 1.

17. A digital sigma-delta modulator for modulating a digital input signal (x) comprising:
    a quantizer for quantizing a sum signal (s) and producing a quantized output signal at a first output (y) and an error output signal (−q) at a second output;
    an input adder;
    a systolic array connected to the input adder at an input side of the systolic array and to the quantizer at an output side of the systolic array;
    at least one feedback connection between the quantizer and at least one of the input adder or the systolic array.

18. The digital sigma-delta modulator of claim 17, wherein the systolic array comprises a digital filter for modulator feedback.

* * * * *